United States Patent [19]

Günther

[11] 4,072,820
[45] Feb. 7, 1978

[54] APPARATUS FOR CODING INPUT DATA CHARACTERS

[75] Inventor: Gerd-Joachim Günther, Munich, Germany

[73] Assignee: Siemens Aktiengesellschaft, Berlin & Munich, Germany

[21] Appl. No.: 726,405

[22] Filed: Sept. 24, 1976

[30] Foreign Application Priority Data

Sept. 25, 1975 Germany .............................. 2542864

[51] Int. Cl.² .............................................. G06F 3/14
[52] U.S. Cl. ................................ 178/23 R; 178/17 C; 178/30; 178/79; 340/324 AD
[58] Field of Search ................... 178/17 C, 17.5, 26 R, 178/26 A, 30, 23 R, 79, 80, 88, 89, 4; 340/324 AD, 172.5

[56] References Cited

U.S. PATENT DOCUMENTS

| 3,778,817 | 12/1973 | Silverberg | 178/17 C |
| 3,996,584 | 12/1976 | Plager | 340/324 AD |

Primary Examiner—Thomas A. Robinson
Attorney, Agent, or Firm—Hill, Gross, Simpson, Van Santen, Steadman, Chiara & Simpson

[57] ABSTRACT

Apparatus for coding input data characters from a keyboard incorporates apparatus for recognizing characters which are to be represented by two successive code representations, rather than the usual single code representation for each character. When a two-code character is recognized, ordinary operation of the apparatus is inhibited, and an auxiliary counter is energized which, in conjunction with a fixed-value storage device, causes the plural code signals to be generated in the correct sequence, after which normal operation of the apparatus is resumed.

6 Claims, 3 Drawing Figures

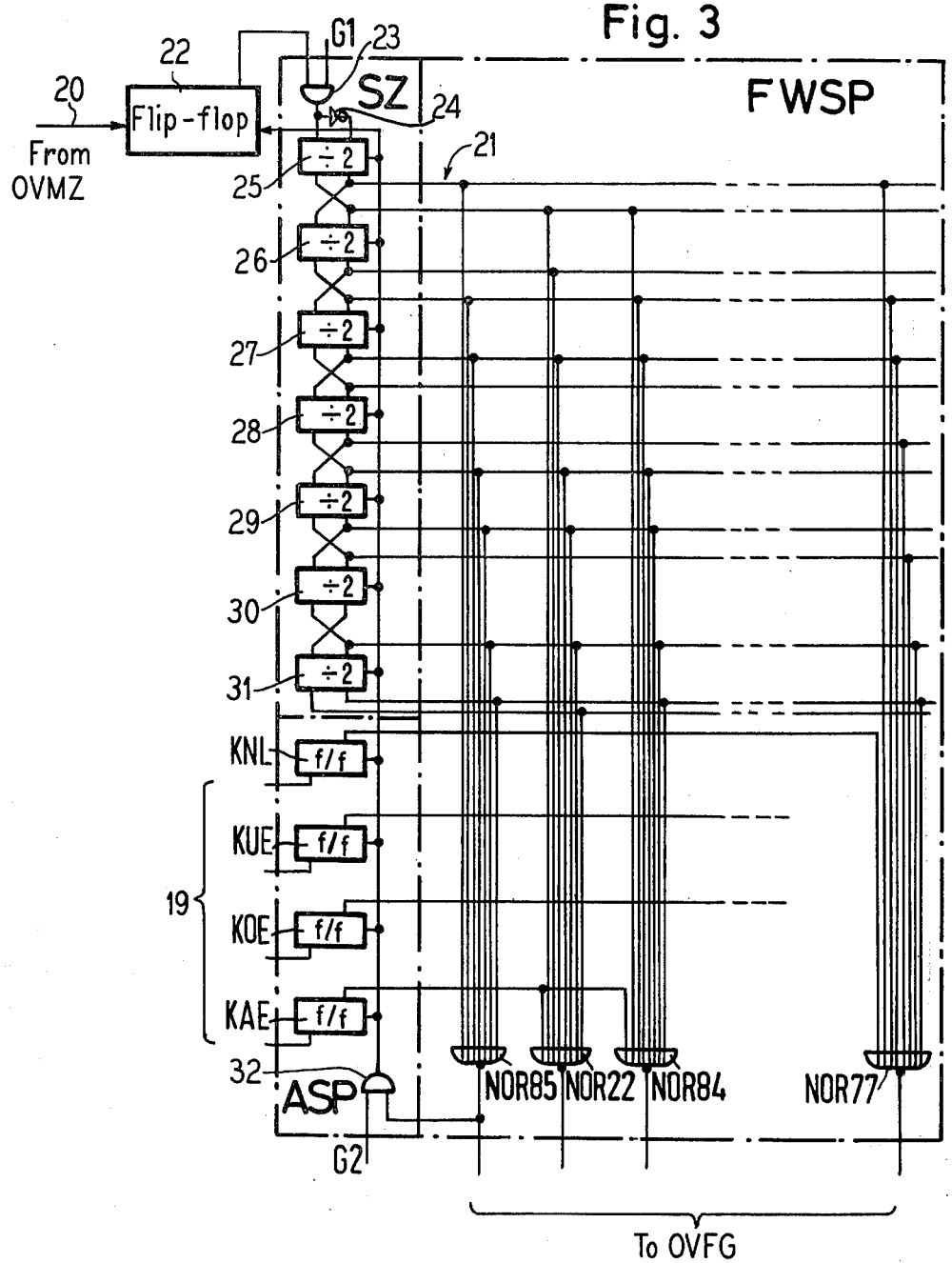

4,072,820

APPARATUS FOR CODING INPUT DATA CHARACTERS

BACKGROUND

1. Field of the Invention

The present invention relates to keyboard data entry systems, and more particularly to such systems which incorporate means for generating two successive coded representations in response to special keyboard characters.

2. The Prior Art

Several conventional codes have been developed for coding input data from a keyboard and the like, and such codes incorporate a single-coded representation for each letter or numeral code of the key-board which is depressed or otherwise operated. The conventional codes are generally six bits in length, so they can accommodate 64 different coded representations of alphanumeric data.

Certain special characters occur in some languages, however, which are not readily handled by the conventional code systems. For example, when an umlaut appears over a vowel in a German language word, some conventional codes do not provide for the umlaut, and most printing devices do not provide for the umlaut. The accepted practice, in translating from the German umlaut form into a non-umlaut form, is to insert an additional letter, viz. "e", following the vowel with the umlaut deleted. For example, ä becomes ae, etc.

Heretofore, there has been no known way of using a keyboard which conventionally produces one coded representation for each key stroke, in such a way as to make the conversion from an umlaut form to an non-umlaut form. Accordingly, it is desirable to provide such as apparatus, so that such conversions can be made quickly and easily.

It is also desirable to provide means for making other conversions for special characters. For example, when a signal is generated to indicate a carriage return, it is sometimes desirable to provide two separate characters indicative of a carriage return and a line feed function. Also, when a printing mechanism is being used with a relatively slow carriage return, in relation to the data transmission speed, it is sometimes desirable to insert a filler character, such as a second carriage return character, to allow more time for the carriage return to be effected.

It is also desirable to provide means for automatically converting a key stroke of the German character B into the characters "ss".

BRIEF DESCRIPTION OF THE INVENTION

A principal object of the present invention is to provide means for use in conjunction with a conventional keyboard data entry apparatus for generating multiple code signals in response to the occurrence and recognition of codes for certain special characters.

Another object of the present invention is to provide a simple and effective assembly for generating multiple code signals.

Another object of the present invention is to provide means for inhibiting normal operation of a keyboard data entry device in response to the recognition of codes for special characters for which multiple code signals are desired, and for inserting substitute and/or additional codes, and for restoring normal operation of the data entry device when the multiple codes have been generated.

These and other objects and advantages of the present invention will become manifest upon an examination of the following description and the accompanying drawings.

In one embodiment of the present invention, there is provided means connected to a keyboard and responsive to a closed key switch for providing a coded representation of the identity of the closed key switch, storage means normally operative to store such coded representation, means responsive to said keyboard for recognizing a special character and for inhibiting the storage means when such special key is recognized, and means for generating a plurality of coded representations in response to recognition of said special character, means for transmitting said plurality of coded representations to said storage device, and means for resuming normal operation of said storage means after said plurality of coded representations have been transmitted.

BRIEF DESCRIPTION OF THE DRAWINGS

Reference will now be made to the accompanying drawings in which:

FIG. 3 is a functional block diagram of the portion of FIG. 1 which generates plural characters in response to recognition of a special character.

DESCRIPTION OF THE PREFERRED EMBODIMENT

Figure 1:
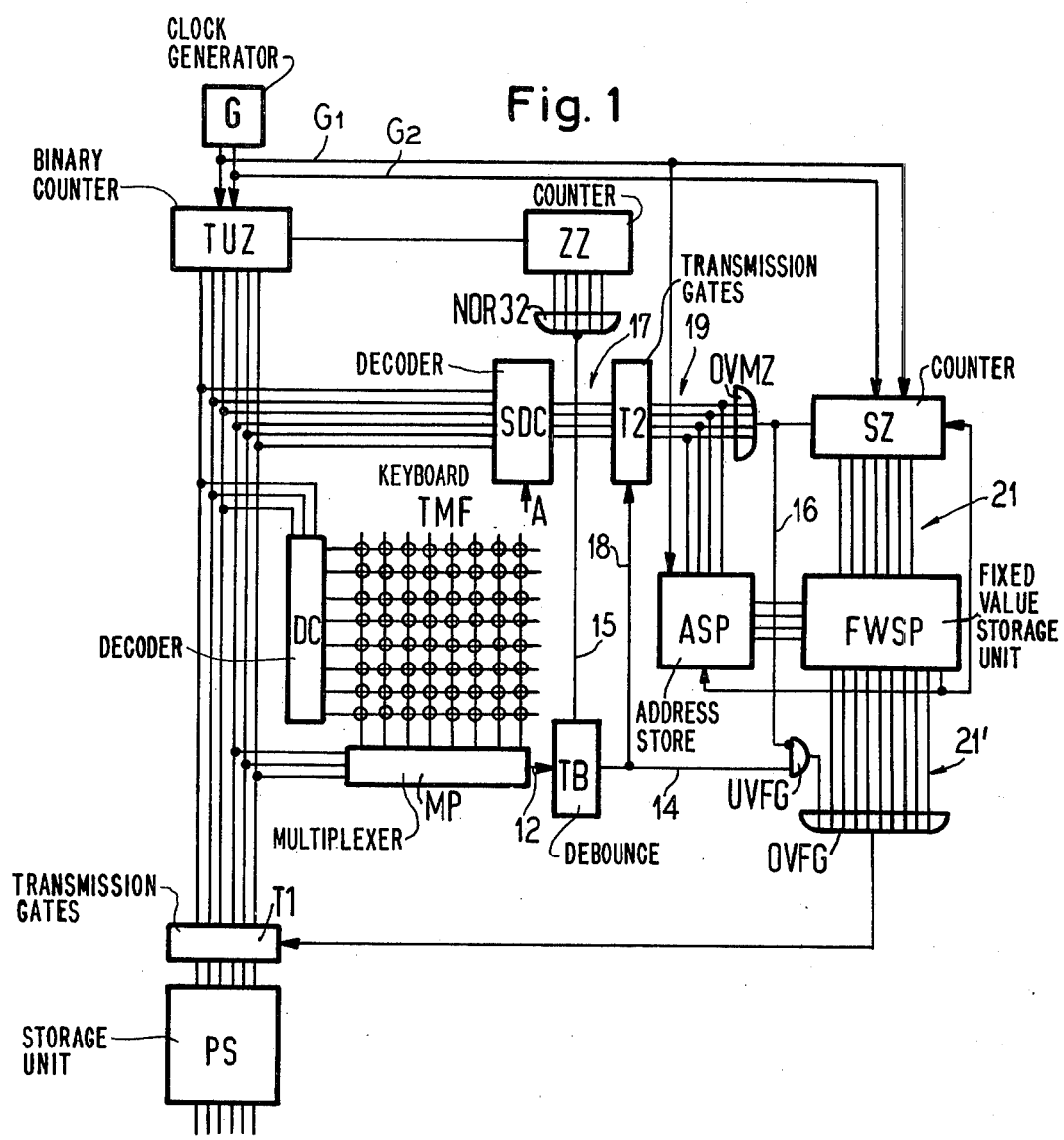
FIG. 1 is a functional block diagram of an illustrative embodiment of the present invention.

Referring now to FIG. 1, a clock generator G is provided which produces a two-phase clock on the lines G-1 and G-2, which are connected to various elements in the apparatus of FIG. 1. The lines G-1 and G-2 are connected to a six-stage binary counter TUZ, which produces a coded representation on six output lines in repetitive cyclical fashion.

Figure 2:
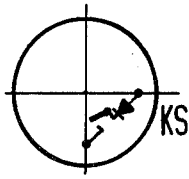
FIG. 2 is a schematic circuit diagram of a circuit associated with one intersection of the keyboard matrix employed in the apparatus of FIG. 1.

A keyboard TMF is provided with a plurality of switches arranged in a matrix array, each of the key switches being provided for closing an intersection between a row line and a column line of the matrix (FIG. 2).

Three of the six output lines of the counter TUZ are connected to a decoder unit DC, and the outputs of the decoder unit DC are connected to the several rows of the matrix. The other three output lines of the counter TUZ are connected to the control inputs of a multiplex unit MP, the data inputs of which are connected to the column lines of the matrix TMF. An output is produced by the multiplex unit MP on a line 12, whenever a key switch is closed, and the time of occurrence of the pulse on the line 12 coincides with production of a coded representation of such key at the output from the counter TUZ. The line 12 is connected to a debounce circuit TB, which produces a signal on an output line 14 only in response to the first pulse appearing on the line 12 during a given time interval. The time interval is controlled by means of a counter ZZ connected with the counter TUZ, which is adapted to inhibit operation of the (debounce) unit TB for five cycles of operation of the counter TUZ. A NOR-gate 32 is connected to the five outputs of the counter ZZ to produce a single inhibiting signal on a line 15 connected with the debounce unit TB.

The six outputs lines of counter TUZ are connected through a series of transmission gates T1 to a storage device PS. Normally, the signal on the line 14 is connected to the control input of the gates T1, so that the coded representation manifested by the counter TUZ is transmitted by the gates T1 to the storage device PS whenever a signal appears on the line 14.

As thus far described, the keyboard data entry apparatus is conventional, and so no further detailed description is required. The apparatus is operative to pass to the storage unit PS coded representations of each key stroke, since the signals which are produced on the line 14 occur at a time when the output of the counter TUZ is representative of the closed key switch responsible in each case, for the signal on the line 14.

The line 14 is normally connected to the control input of the gates T1 through an AND-gate UVFG and an OR-gate OVFG. The line 14 is connected to one input of the AND-gate, which is normally enabled by a low signal applied to its other input. Thus, any signal appearing on the line 14 is passed through the AND-gate UVFG and the OR-gate OVFG to the control input of the gates T1. It is necessary to inhibit operation of the circuit when a plural code character is to be generated. At this time, the inhibiting input to the gate UVFG goes high, inhibiting operation of the gate, so that the signal to the line 14 is not supplied to the control input of the gates T1.

The six output lines of the counter TUZ are connected to six input terminals of a decoder circuit SDC, which contains gates arranged to produce an output signal on one of four output lines 17 whenever the outputs from the couter TUZ identify one of four special characters. If the key switch for one of the four special characters is, at the time, operated or closed, an enabling signal is provided on a line 18, connected to the control inputs of a series of transmission gates T2, and the signal present on one of the lines 17 is transmitted through the gates T2.

The four output lines 19 from the gates T2 are connected to inputs of a four-input OR-gate OVMZ, which produces a signal at its output at the time of a pulse on the line 14, whenever one of four special characters is detected by the decoder circuit SDC. The output of the OR-gate OVMZ is connected by a line 16 to the inhibiting input of the AND-gate UVFG, and is also connected to an input of a counter unit SZ. The counter unit SZ is thereby enabled to count signals originating in the clock generator G, and to produce a binary-coded representation of the contents of the counter on a plurality of output lines 21. The lines 21 are connected to inputs of a fixed-value store unit FWSP, which also receives inputs from an address-store device ASP, which is controlled in accordance with which of the lines 19 has been energized. The unit FWVP is operative to produce output pulses on several output lines 21', which are connected through the OR-gate OVFG to the control input of the gates T1. The output signals produced by the fixed-value store device FWSP occur at times corresponding to successive coded representations present on the output lines of the counter TUZ. When the generation of these coded representations is complete, the counter SZ and the address-store ASP are both reset, in conjunction with signals from the clock generator G.

Referring now to FIG. 3, a more detailed functional block diagram illustrates the construction of the fixed-value store unit FWSP, together with its address-store ASP and its auxiliary counter SZ.

The flip-flop 22 has its set input connected to the line 20, so that the flip-flop 22 is set whenever a pulse arrives on the line 20, for the purpose of signaling that a special plural-code character has been detected. The output of the flip-flop 22 is connected to one input of an AND-gate 23, the other input of which is connected to the G1 line from the clock generator G. The output of the AND-gate 23 is connected directly and through an inverter 24 to inputs of a first binary divider unit 25, which functions as a divide-by-two unit. The Q and $\overline{Q}$ outputs of the divide-by-two unit 25 are connected to two inputs of the fixed-value store FWSP, via two of the lines 21.

Six additional divide-by-two units 26-31 are connected in cascade with the unit 25, and outputs of the units 25-31 are connected via the lines 21 to the fixed-value store unit FWSP. The units 25-31 form a binary counter, so that the signals on the lines 21 indicate, at any given time, the number of clock pulses arriving on the line G1 subsequent to the setting of the flip-flop 22 by the signal on the line 20.

The fixed-value store unit FWSP comprises a series of NORgates 22, 84, 77 and 85, and others (not shown), for producing signals on a plurality of output lines which are connected to inputs of the ORgate OVFG.

The lines 19 are connected to the set inputs of a plurality of flip-flops KAE, KOE, KUE, and KNL, which form the address-store ASP of the fixed-value store device FWSP. The flip-flop KAE is set when an ä is recognized, the flip-flop KOE is energized when a ö is recognized, the KUE flip-flop is energized when a ü is recognized, and the flip-flop KNL is set when a carriage return character is recognized. The Q output of the flip-flop KAE is connected to one input of each of the gates NOR 22 and NOR 84, and the flip-flops KOE and KUE are similarly connected to other NOR-gates (not shown). The Q output of the flip-flop KNL is connected to an input of the NOR-gate 77.

In operation, the lowermost line 19 is energized when an a is recognized by the decoder unit SDC. The Q output of the flip-flop KAE is connected to one input each of the gates NOR 22 and NOR 84 to enable these gates to output a high level, or positive-going, pulse whenever all of their other inputs simultaneously have low levels. The other inputs of the gates NOR 22 and NOR 84 are connected to various Q and $\overline{Q}$ outputs of the flip-flops 25-31, so that they are adapted to produce output pulses when the state of the counter SZ assumes a predetermined condition. Specifically, the gate NOR 22 produces a positivegoing output pulse when the counter SZ has been counted for 22 pulse times, and the gate NOR 84 produces a positive-going output pulse when the counter SZ has been counted for 84 pulse times. The gate NOR 85 is connected to various Q and $\overline{Q}$ outputs of the flip-flops 25-31 and produces a positive-going pulse which is gated with the signal on the G2 line in an AND gate 32, to provide a reset signal for resetting all of the flip-flops of the address-store unit ASP and the counter SZ.

The pulse produced by the gate NOR 22, 22 pulse times after the ä is recognized, coincides with the time at which the counter TUZ is producing a coded representation of the letter "a". The output of the gate NOR occurs at a time when the coded representation produced by the counter TUZ is representative of the letter "e", so that the gates T1 passed coded representation corresponding to the letters "a" and "e" to the storage unit PS, sequentially, in response to the detection of the ä by means of the decoding unit SDC. No coded representation corresponding to ä is passed by the gates T1, because each time that character is recognized, a signal on the line 16 is produced which inhibits operation of the gate UVFG.

The gate NOR 77 operates in a similar way, to produce a pulse 77 pulse times after a carriage return signal is identified, to pass to the storage unit PS a coded representation of a line-feed command. If a carriage return code is also desired, it is transmitted to the storage device PS at the proper time by operation of another NOR gate (not shown) which is effective to produce a pulse the next time that the output of the counter TUZ is representative of a carriage return code. In this case, the carriage return code and a line-feed code are substituted for a single carriage return code. The operation of the unit when the ö and ü characters are detected is similar, and takes place with additinal NOR gates (not shown). In any case, the address-store device and the couunter SZ is reset to its zero or initial condition 85 pulse times after any special character has been detected, after which normal operation of the keyboard and entry device can be resumed.

Although the fixed-value store device FWSP allows two-coded representations to be passed to the storage device PS for one key depression, it does not interfere with normal operation of the keyboard TMF, because of the extremely rapid speed with which the two characters are generated. Both of the characters are generated within the lockout period established by the debounce unit TB.

The gates included in the decoding units DC have not been illustrated specifically, but they may be of the same general type as the gates NOR 22, and NOR 84, etc. A separate gate is provided for each of the four output lines 17, so that one of the four output lines 17 is energized whenever a special character is detected. An additional input line A is provided to the gates of the decoding unit SDC to inhibit their operation when it is desired to pass to the storage unit PS a coded representation of a special character, rather than the substitute characters generated by the fixed-value store unit FWSP. The inhibiting input to the gates is comparable to the input to the gates NOR 22 and NOR 84 from the flip-flop KAE.

The construction and operation of the various flip-flops 22, KAE, etc., is conventinal and need not be described. The divide-by-two units 25-31 may conveniently be conventional toggle type flip-flops, such as JK flip-flops, etc. If desired, they may be master-slave type flip-flops. Also, if desired, all of the divide-by-two units making up the counter SZ may be constructed in the manner so that they operate synchronously under the control of one of the outputs of the clock generator G, so that the level changes on the lines 21 occur simultaneously.

Other modifications and additions in the apparatus of the present invention will be apparent to those skilled in the art, without departing from the essential features of novelty involved, which are intended to be defined and secured by the appending claims.

What is claimed is :

1. Apparatus for the input coding of keyboard data characters comprising, a keyboard having a plurality of row lines and a plurality of column lines, means for interconnecting a row line with a column line in response to the depression of a key of the keyboard, counter means for sequentially manifesting coded representations of all of the keys of said keyboard, normally operative means for transmitting a said coded representation to an output at a time corresponding to the representation by said counter means of an operated key of said keyboard, detector means for detecting codes representative of special characters, means for inhibiting transmission of the special character-representative code, an auxiliary counter, means for initiating operation of the auxiliary counter in response to detection of a code representative of a special character, and means interconnected with said auxiliary counter for transmitting coded representations produced by said main counter at times when said representations correspond to plural code representations to be substituted for said special character-representative code.

2. Apparatus according to claim 1 including a decoding device connected to said main counter and responsive to coded representations produced thereby corresponding to special characters, an address-store unit connected to said decoding device and adapted to store an indication of a special character which has been detected, and a plurality of gates interconnected with said address-store unit and with said auxilliary counter for producing pulses simultaneously with the times that said main counter produces signals indicative of the coded representations to be substituted for said special character-representative code.

3. Apparatus according to claim 1 including means for deriving a pulse from said keyboard at the time said main counter produces a coded representation of an operated key, a gate connected to receive said pulse, the output of said gate being adapted to operate transmission gates for transmitting said coded representation to said output, and means for inhibiting said gate in response to the detection of a special character.

4. Apparatus according to claim 1, including gate means responsive to said auxiliary counter for resetting said auxiliary counter.

5. Apparatus according to claim 1 including multiplex means for successively scanning the keys of said keyboard and producing an output pulse at a time when an operated key has been scanned, said normally operative means being normally responsive to said output pulse 6. Apparatus for the coding of data characters comprising means for sequentially manifesting coded representations of characters, normally operative means for transmitting said coded representations to an output at a time corresponding to the manifestation of each of said representations, detector means for detecting codes representative of special characters, means for inhibiting transmission of the special character-representative code, an auxiliary counter, means for initiating operation of the auxiliary counter in response to detection of a code representative of a special character, and means interconnected with said auxiliary counter for transmitting coded representations produced by said main counter at times when said representations correspond to plural code representations to be substituted for said special character-representative code.

* * * * *